United States Patent
Jeong et al.

(10) Patent No.: US 8,395,182 B2
(45) Date of Patent: Mar. 12, 2013

(54) LIGHT EMITTING DEVICE, LIGHT EMITTING DEVICE PACKAGE, METHOD OF MANUFACTURING LIGHT EMITTING DEVICE AND ILLUMINATION SYSTEM

(75) Inventors: Hwan Hee Jeong, Seoul (KR); Sang Youl Lee, Seoul (KR); Ji Hyung Moon, Seoul (KR); June O Song, Seoul (KR); Kwang Ki Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/030,600

(22) Filed: Feb. 18, 2011

(65) Prior Publication Data
US 2011/0204402 A1   Aug. 25, 2011

(30) Foreign Application Priority Data
Feb. 23, 2010  (KR) .................. 10-2010-0016043

(51) Int. Cl.
*H01L 33/00* (2010.01)
(52) U.S. Cl. ................ 257/100; 257/E33.055
(58) Field of Classification Search .......... 257/100, 257/E33.055
See application file for complete search history.

(56) References Cited

U.S. PATENT DOCUMENTS

| | | | | |
|---|---|---|---|---|
| 5,963,787 A * | 10/1999 | Kimura et al. | .................. | 438/46 |
| 6,171,876 B1 * | 1/2001 | Yuang et al. | .................. | 438/22 |
| 7,002,185 B2 * | 2/2006 | Isokawa | .................. | 257/99 |
| 7,268,372 B2 | 9/2007 | Park et al. | | |
| 7,405,431 B2 | 7/2008 | Aoyagi et al. | | |
| 7,977,686 B2 | 7/2011 | Ibbetson et al. | | |
| 2001/0016251 A1 * | 8/2001 | Sugimoto | .................. | 428/209 |
| 2007/0069218 A1 | 3/2007 | Chen et al. | | |
| 2008/0142820 A1 | 6/2008 | Edmond et al. | | |
| 2011/0272728 A1 | 11/2011 | Rode et al. | | |

FOREIGN PATENT DOCUMENTS

| | | |
|---|---|---|
| CN | 1750286 A | 3/2006 |
| CN | 1945861 A | 4/2007 |
| JP | 2000-91628 A | 3/2000 |
| JP | 2001-339100 A | 12/2001 |
| JP | 2006-86300 A | 3/2006 |
| JP | 2008-505508 A | 2/2008 |
| JP | 2008-153669 A | 7/2008 |
| JP | 2011-520270 A | 7/2011 |
| KR | 10-2006-0082113 A | 7/2006 |
| KR | 10-0609968 B1 | 7/2006 |
| WO | WO 2005/013382 A1 | 2/2005 |
| WO | WO 2009/125953 | 10/2009 |

* cited by examiner

*Primary Examiner* — Julio J Maldonado
*Assistant Examiner* — Amar Movva
(74) *Attorney, Agent, or Firm* — McKenna Long & Aldridge LLP (57) ABSTRACT

A light emitting device according to the embodiment includes a substrate; a protective layer on the substrate; a electrode layer on the protective layer; a light emitting structure disposed on the electrode layer to generate light and provided with a first semiconductor layer, an active layer under the first semiconductor layer, and a second conductive semiconductor layer under the active layer; and a first electrode having a first end disposed on a top surface of the light emitting structure and a second end disposed on the protective layer. The protective layer comes into Schottky contact with at least one of the electrode layer and the first electrode.

17 Claims, 7 Drawing Sheets

LIGHT EMITTING DEVICE, LIGHT EMITTING DEVICE PACKAGE, METHOD OF MANUFACTURING LIGHT EMITTING DEVICE AND ILLUMINATION SYSTEM

The present application claims priority under 35 U.S.C. §119(a) of Korean Patent Application No. 10-2010-0016043 filed on Feb. 23, 2010, which is hereby incorporated by reference in its entirety as if fully set forth herein.

BACKGROUND

A light emitting diode (LED) is a kind of semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for illumination devices such as various lamps, liquid crystal displays, electric signboards, and street lamps.

SUMMARY

The embodiment provides a light emitting device having a novel structure, a light emitting device package, a method of manufacturing the light emitting device, and an illumination system.

The embodiment provides a light emitting device having high reliability, a light emitting device package, a method of manufacturing the light emitting device, and an illumination system.

A light emitting device according to the embodiment includes a substrate; a protective layer on the substrate; a electrode layer on the protective layer; a light emitting structure formed on the electrode layer to generate light and provided with a first semiconductor layer, an active layer under the first semiconductor layer, and a second conductive semiconductor layer under the active layer; and a first electrode having a first end disposed on a top surface of the light emitting structure and a second end disposed on the protective layer, wherein the protective layer comes into Schottky contact with at least one of the electrode layer and the first electrode.

A light emitting device package according to the embodiment includes a package body; first and second electrodes on the package body; and a light emitting device electrically connected to the first and second electrodes, wherein the light emitting device comprises: a substrate; a protective layer on the substrate; a electrode layer on the protective layer; a light emitting structure formed on the electrode layer to generate light and provided with a first semiconductor layer, an active layer under the first semiconductor layer, and a second conductive semiconductor layer under the active layer; and a first electrode having a first end disposed on a top surface of the light emitting structure and a second end disposed on the protective layer, and wherein the protective layer comes into Schottky contact with at least one of the electrode layer and the first electrode.

An illumination system according to the embodiment includes a light emitting module including a first substrate and a light emitting device installed on the substrate, wherein the light emitting device comprises: a second substrate; a protective layer on the second substrate; a electrode layer on the protective layer; a light emitting structure formed on the electrode layer to generate light and provided with a first semiconductor layer, an active layer under the first semiconductor layer, and a second conductive semiconductor layer under the active layer; and a first electrode having a first end disposed on a top surface of the light emitting structure and a second end disposed on the protective layer, and wherein the protective layer comes into Schottky contact with at least one of the electrode layer and the first electrode.

A method of manufacturing a light emitting device according to the embodiment includes forming a protective layer on a first substrate and forming a first body including a first adhesive layer on the protective layer; forming a light emitting structure on a second substrate and forming a second body including a second adhesive layer on the light emitting structure; bonding the first adhesive layer to the second adhesive layer in opposition to each other such that the first body is bonded to the second body, thereby forming a electrode layer; removing the second substrate; performing an isolation etching on the light emitting structure; selectively removing the electrode layer such that at least a part of the protective layer is exposed; and forming a first electrode having one end disposed on a top surface of the light emitting structure and an opposite end disposed on an exposed part of the protective layer, wherein the protective layer comes into Schottky contact with at least one of the electrode layer and the first electrode.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device, a method of manufacturing the light emitting device, and a light emitting device package according to the embodiments will be described with reference to the accompanying drawings.

Figure 1:
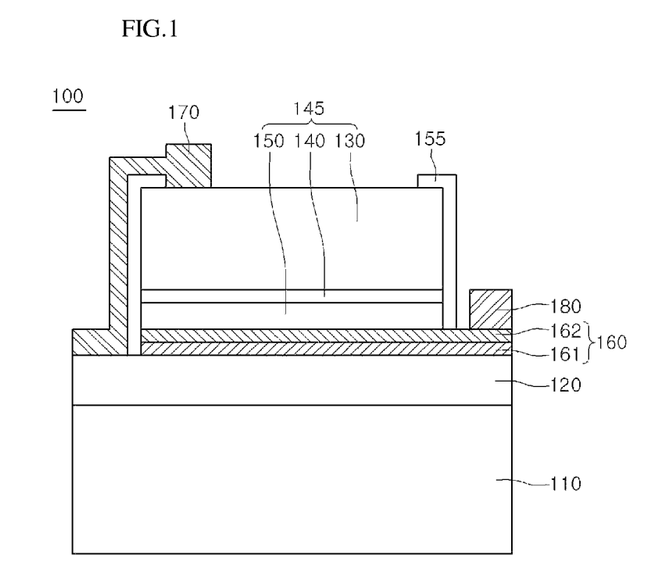
FIG. 1 is a sectional view showing a light emitting device according to the first embodiment.

FIG. 1 is a sectional view showing a light emitting device 100 according to the first embodiment.

Referring to FIG. 1, the light emitting device 100 according to the first embodiment includes a first substrate 110, a protective layer 120 on the first substrate 110, a electrode layer 160 on the protective layer 120, a light emitting structure 145 disposed on the electrode layer 160 to generate light, a first electrode having one end disposed on the top surface of the light emitting structure 145 and the other end disposed on the protective layer 120, and a second electrode 180 on the electrode layer 160.

The protective layer 120 comes into Schottky contact with at least one of the electrode layer 160 and the first electrode 170.

Thus, when power corresponding to operational voltage of the light emitting structure 145 is applied to the light emitting device 100, the light emitting structure 145 normally generates the light, but current may not flow through the protective layer 120 due to the Schottky barrier resulted from the Schottky contact.

However, if excessive forward or reverse voltage is applied to the light emitting device 100 due to the electro static discharge (ESD) or surge effect, the Schottky barrier is electrically conducted so that the current flows through the protective layer 120 instead of the light emitting structure 145, thereby preventing the light emitting structure 145 from being damaged.

That is, according to the light emitting device 100 of the first embodiment, the protective layer 120 is formed below the light emitting structure 145, so the withstanding voltage characteristic can be improved without reducing the light emitting area of the light emitting structure 145.

Hereinafter, the elements of the light emitting device 100 according to the first embodiment will be described in detail.

The first substrate 110 is an insulating substrate. For instance, the first substrate 110 may include sapphire ($Al_2O_3$), but the embodiment is not limited thereto.

The protective layer 120 is grown from the top surface of the first substrate 110.

For instance, the protective layer 120 includes semiconductor material, such as Si, GaN, InN, AlN, InGaN, AlGaN, InAlGaN, AlInN, AlGaAs, InGaAs, AlInGaAs, GaP, AlGaP, InGaP, AlInGaP, or InP. In addition, the protective layer 120 can be doped with n type or p type conductive dopant, but the embodiment is not limited thereto.

The first electrode 170 and the electrode layer 160 are formed on the top surface of the protective layer 120.

The protective layer 120 comes into Schottky contact with at least one of the first electrode 170 and the electrode layer 160.

Therefore, if the voltage sufficient for generating the light from the light emitting structure 145 is applied to the light emitting device 100, the current may not flow through the protective layer 120 due to the Schottky contact.

However, if the excessive voltage is applied to the light emitting device 100, the Schottky barrier resulted from the Schottky contact is electrically conducted so that the current flows through the protective layer 120 instead of the light emitting structure 145, thereby improving the withstanding voltage characteristic of the light emitting device 100.

Meanwhile, the breakdown voltage that causes the Schottky barrier to be electrically conducted can be adjusted to the desired level by controlling the doping density of the n type or p type dopant doped in the protective layer 120. The breakdown voltage may be higher than the operational voltage of the light emitting structure. For instance, the breakdown voltage is about 4V to 500V, but the embodiment is not limited thereto.

The electrode layer 160 is formed on the protective layer 120.

The electrode layer 160 reflects the light emitting from the light emitting structure 145 and comes into ohmic contact with the light emitting structure 145 to supply power to the light emitting structure 145. In addition, the electrode layer 160 may come into ohmic contact or Schottky contact with the protective layer 120.

To this end, the electrode layer 160 may have a multiple layer structure.

For instance, the electrode layer 160 may include a first layer 161 making contact with the protective layer 120 and a second layer 162 formed on the first layer 161 to reflect the light emitted from the light emitting structure 145.

The first layer 161 may selectively include p-ohmic metal or n-ohmic metal depending on material or polarity of the protective layer 120 to make ohmic contact or Schottky contact with the protective layer 120. Preferably, the first layer 161 includes material having superior adhesive property. For instance, the first layer 161 may include at least one selected from Au, Sn, In, Pd, Cu, Mo, W, Si, Ta, Nb and Ni.

The second layer 162 includes metallic material having high reflective efficiency to effectively reflect the light emitted from the light emitting structure 145. For instance, the second layer 162 may include at least one selected from Ag, Rh, Ni, Au, Pd, Ir, Ti, Pt, W, and Al.

In addition, a diffusion barrier layer (not shown) can be interposed between the first and second layers 161 and 162 to prevent inter-diffusion between the first and second layers 161 and 162. Further, an adhesion reinforcing layer (not shown) can be provided between the first and second layers 161 and 162 to reinforce the coupling state between the first and second layers 161 and 162. For instance, the diffusion barrier layer may include at least one selected from the group consisting of Ti, Ni, Cu, N, Zr, Cr, Ta, and Rh. In addition, the adhesion reinforcing layer may include at least one selected from Au, Sn, Ni, In, and Ti.

If the second layer 162 does not make ohmic contact with the light emitting structure, an ohmic layer (not shown) is formed on the second layer 162. For instance, the ohmic layer may include at least one selected from the group consisting of ITO, IZO, AZO, Ni, Pt, Pd, Ir, Rh, Ru, and Ag.

Meanwhile, at least a part of the top surface of the base electrode 160 has no light emitting structure 145, so this part can be exposed to the outside. The second electrode 180 may be formed on the exposed top surface of the base electrode 160.

The first and second electrodes 170 and 180 supply power from the external electrode to the light emitting structure 145. The second electrode 180 can be prepared as a single layer or a multiple layer including at least one selected from Al, Ti, Cr, Ni, Cu, and Au.

The light emitting structure 145 is formed on the electrode layer 160.

The light emitting structure 145 generates the light and has a stack structure in which a second conductive semiconductor layer 150, an active layer 140 and a first conductive semiconductor layer 130 are sequentially stacked.

A buffer layer (not shown) and/or an undoped nitride layer (not shown) can be formed on the first substrate 110 to attenuate difference in lattice constant.

The second conductive semiconductor layer 150, for example, includes a p type semiconductor layer. The p type semiconductor layer may include semiconductor material having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AlInN, AlN, or InN. In addition, the p type semiconductor layer may be doped with p type dopant such as Mg or Zn.

The active layer 140 is formed on the second conductive semiconductor layer 150. Electrons (or holes) injected through the first conductive semiconductor layer 130 meet holes (or electrons) injected through the second conductive semiconductor layer 150 at the active layer 140, so that the active layer 140 emits the light based on the band gap difference of the energy band according to material of the active layer 140.

The active layer 140 may have a single quantum well structure, a multiple quantum well (MQW) structure, a quantum wire structure or a quantum dot structure, but the embodiment is not limited thereto.

The active layer 140 may include semiconductor material having the compositional formula of $In_xAl_yGa_{1-x-y}N$ ($0 \leq x \leq 1$, $0 \leq y \leq 1$, $0 \leq x+y \leq 1$). If the active layer 140 has the MQW structure, the active layer 140 has a stack structure including a plurality of well layers or a plurality of barrier layers. For instance, the active layer 140 may have a stack structure of an InGaN well layer/a GaN barrier layer.

A clad layer (not shown) doped with the n type or p type dopant can be formed on and/or under the active layer 140. The clad layer may include an AlGaN layer or an InAlGaN layer.

An undoped semiconductor layer can be formed on the first conductive semiconductor layer 130, but the embodiment is not limited thereto.

The first conductive semiconductor layer 130, for example, includes an n type semiconductor layer. The n type semiconductor layer may include semiconductor material having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AlInN, AlN, or InN. In addition, the n type semiconductor layer may be doped with n type dopant such as Si, Ge, or Sn.

The undoped semiconductor layer is not doped with conductive dopant, so the undoped semiconductor layer has electrical conductivity significantly lower than that of the first conductive semiconductor layer 130 and the second conductive semiconductor layer 150. Thus, the undoped semiconductor layer is grown for improving crystallization of the first conductive semiconductor layer 130.

In contrast, the first conductive semiconductor layer 130 may include a p type semiconductor layer and the second conductive semiconductor layer 150 may include an n type semiconductor layer. In addition, a third conductive semiconductor layer (not shown) including an n type or a p type semiconductor layer can be formed on the first conductive semiconductor layer 130. Thus, the light emitting device 100 may have one of NP, PN, NPN and PNP junction structures. In addition, the conductive dopant can be uniformly or non-uniformly doped in the first and second conductive semiconductor layers 130 and 150. That is, the light emitting structure 145 may have various structures and the embodiment is not limited thereto.

A protective member 155 can be formed on some portions of a lateral side and a top surface of the light emitting structure 145. The protective member 155 can prevent the light emitting structure 145 from being electrically shorted with respect to the first electrode 170 and/or the external electrode.

The protective member 155 includes material having electric insulation property. For instance, the protective member 155 includes one selected from the group consisting of $SiO_2$, $Si_xO_y$, $Si_3N_4$, $Si_xN_y$, $SiO_xN_y$, $Al_2O_3$, and $TiO_2$.

One end of the first electrode 170 is disposed on the top surface of the first conductive semiconductor layer 130 and the other end of the first electrode 170 is disposed on the protective layer 120 along the lateral side of the light emitting structure 145.

The first electrode 170 may include material that comes into ohmic contact with the first conductive semiconductor layer 130 and comes into ohmic contact or Schottky contact with the protective layer 120. That is, the first electrode 170 may include p-ohmic metal or n-ohmic metal.

Therefore, although the first electrode 170 normally supplies power to the light emitting structure 145, the first electrode 170 is electrically communicated with the protective layer 120 if excessive current is applied to the light emitting device 100.

The first electrode 170 may have a single layer structure or a multiple layer structure by using at least one selected from Al, Ti, Cr, Ni, Cu and Au.

Hereinafter, the operation of the light emitting device 100 according to the embodiment will be described.

First Example

When the first conductive semiconductor layer 130 is an n type semiconductor layer, the second conductive semiconductor layer 150 is a p type semiconductor layer, the first electrode 170 includes n-ohmic metal, and the first layer 161 of the electrode layer 160 includes p-ohmic metal, the protective layer 120 is an n type or a p type semiconductor layer.

Thus, the protective layer 120 comes into Schottky contact with one of the first electrode 170 and the electrode layer 160.

Second Example

When the first conductive semiconductor layer 130 is an n type semiconductor layer, the second conductive semiconductor layer 150 is a p type semiconductor layer, the first electrode 170 includes n-ohmic metal, and the first layer 161 of the electrode layer 160 includes n-ohmic metal, the protective layer 120 is a p type semiconductor layer.

Thus, the protective layer 120 comes into Schottky contact with both first electrode 170 and electrode layer 160.

Third Example

When the first conductive semiconductor layer 130 is a p type semiconductor layer, the second conductive semiconductor layer 150 is an n type semiconductor layer, the first electrode 170 includes p-ohmic metal, and the first layer 161 of the electrode layer 160 includes n-ohmic metal, the protective layer 120 is an n type of a p type semiconductor layer.

Thus, the protective layer 120 comes into Schottky contact with one of the first electrode 170 and the electrode layer 160.

Fourth Example

When the first conductive semiconductor layer 130 is a p type semiconductor layer, the second conductive semiconductor layer 150 is an n type semiconductor layer, the first electrode 170 includes p-ohmic metal, and the first layer 161 of the electrode layer 160 includes p-ohmic metal, the protective layer 120 is an n type semiconductor layer.

Thus, the protective layer 120 comes into Schottky contact with both first electrode 170 and electrode layer 160.

As mentioned above, since the protective layer 120 comes into Schottky contact with at least one of the first electrode 170 and the electrode layer 160, the protective layer 120 is electrically conducted when the excessive voltage or current is applied to the light emitting device 100, thereby protecting the light emitting structure 145.

In addition, since the protective layer 120 is provided below the light emitting structure 145, the light emitting area of the light emitting structure 145 may not be reduced.

Hereinafter, the method of manufacturing the light emitting device 100 according to the first embodiment will be described. Description about the elements and structures that have already been explained will be omitted or briefly explained in order to avoid redundancy.

FIGS. 2 to 7 are sectional view showing the procedure for manufacturing the light emitting device 100 according to the first embodiment.

Figure 2:
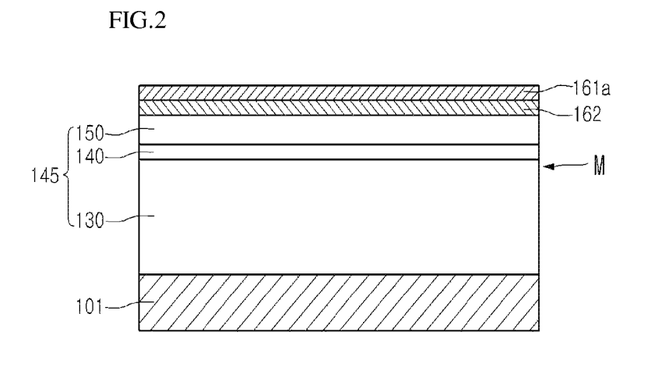
FIGS. 2 to 7 are sectional views showing the procedure for manufacturing a light emitting device according to the first embodiment.

Referring to FIG. 2, the light emitting structure 145 is formed on the second substrate 101, and the second layer 162 of the electrode layer 160 and an adhesive layer 161a are formed on the light emitting structure 145, thereby forming a first body M.

For instance, the second substrate 101 may include at least one material selected from $Al_2O_3$), SiC, GaAs, GaN, ZnO, Si, GaP, $LiAl_2O_3$, InP, BN, AlN and Ge.

For instance, the light emitting structure 145 can be formed through metal organic chemical vapor deposition (MOCVD), chemical vapor deposition (CVD), plasma-enhanced chemical vapor deposition (PECVD), molecular beam epitaxy (MBE), or hydride vapor phase epitaxy (HVPE) scheme, but the embodiment is not limited thereto.

The second layer 162 and the second adhesive layer 161a can be deposited or coated on the light emitting structure 145, but the embodiment is not limited thereto.

The second layer 162 is a reflective layer including metallic material having high reflective efficiency and making ohmic contact with the second conductive semiconductor layer 150 of the light emitting structure 145.

In addition, the second adhesive layer 161a includes metallic material having superior adhesive property so that the first body M is securely bonded to a second body N in the subsequent process by the second adhesive layer 161a.

Figure 3:
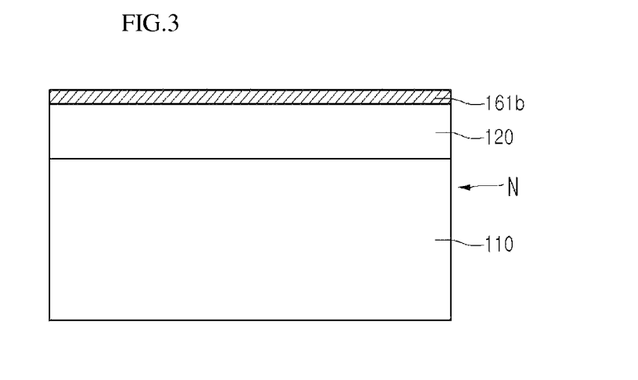

Referring to FIG. 3, the protective layer 120 is formed on the first substrate 110 and the first adhesive layer 161b is formed on the protective layer 120, thereby forming the second body N.

The first adhesive layer 161b includes material adapted to be bonded with the second adhesive layer 161a.

Figure 4:
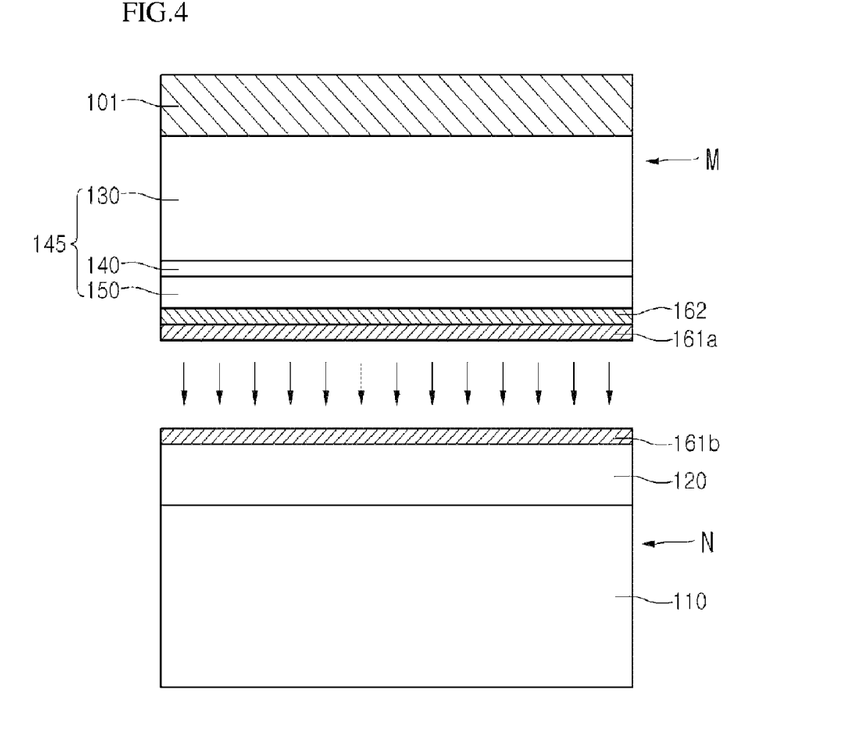

Referring to FIG. 4, the first body M is bonded with the second body N after arranging the second adhesive layer 161a and the first adhesive layer 161b in opposition to each other.

The second adhesive layer 161a is bonded to the first adhesive layer 161b, thereby forming the first layer 161 of the electrode layer 160, but the embodiment is not limited thereto.

Figure 5:
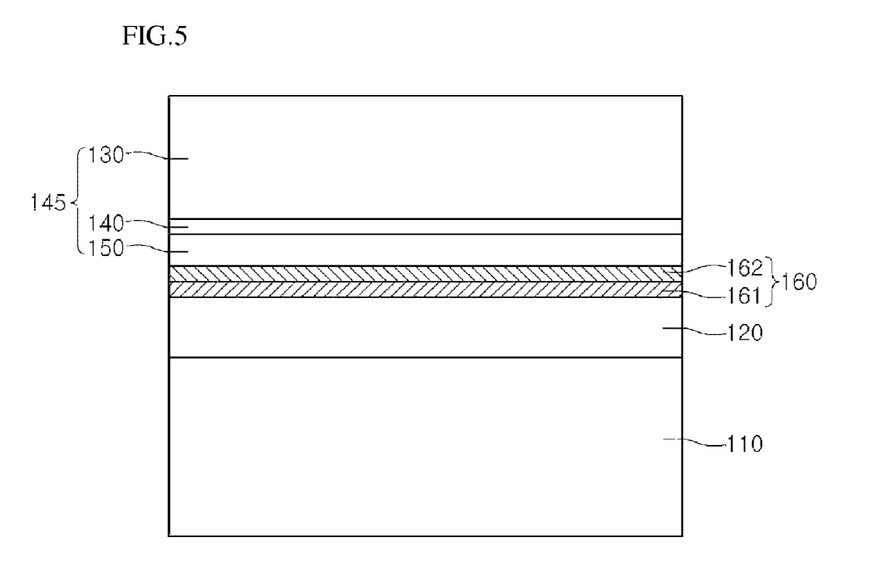

Referring to FIG. 5, the second substrate 101 is removed from the first body M and the second body N which are bonded to each other.

The second substrate 101 can be removed through the laser lift off (LLO) process or an etching process, but the embodiment is not limited thereto.

Figure 6:
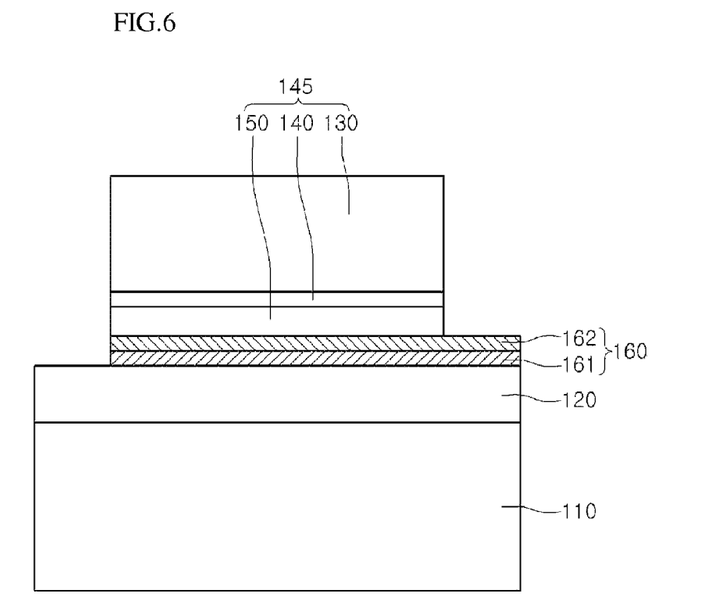

Referring to FIG. 6, an isolation etching is performed with respect to the light emitting structure 145 and at least a part of the base electrode 160 exposed through the isolation etching is removed.

The isolation etching can be performed through a wet isolation etching or a dry isolation etching to classify the plural light emitting devices into individual device units.

At least a part of the electrode layer 160 can be selectively removed to expose the protective layer 120. To this end, a photolithography process or an etching process is performed, but the embodiment is not limited thereto.

Figure 7:
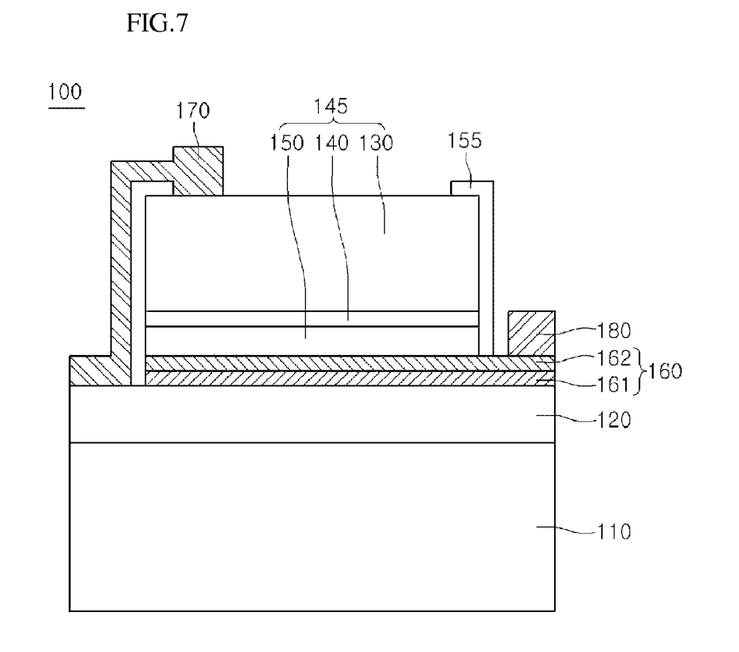

Referring to FIG. 7, the protective member 155 is formed at the side of the light emitting structure 145, and then the first and second electrodes 170 and 180 are formed, thereby providing the light emitting device 100 according to the first embodiment.

The protective member 155 can be formed through the sputtering, PECVD, or E-beam process.

One end of the first electrode 170 is disposed on the top surface of the light emitting structure 145, and the other end of the first electrode 170 is disposed on the exposed protective layer 120. In addition, the second electrode 180 is formed on the exposed top surface of the electrode layer 160.

Second Embodiment

Hereinafter, a light emitting device 100B and a method of manufacturing the light emitting device 100B according to the second embodiment will be described. The description about the elements and structures that have already been explained in the first embodiment will be omitted or briefly explained in order to avoid redundancy.

Figure 8:
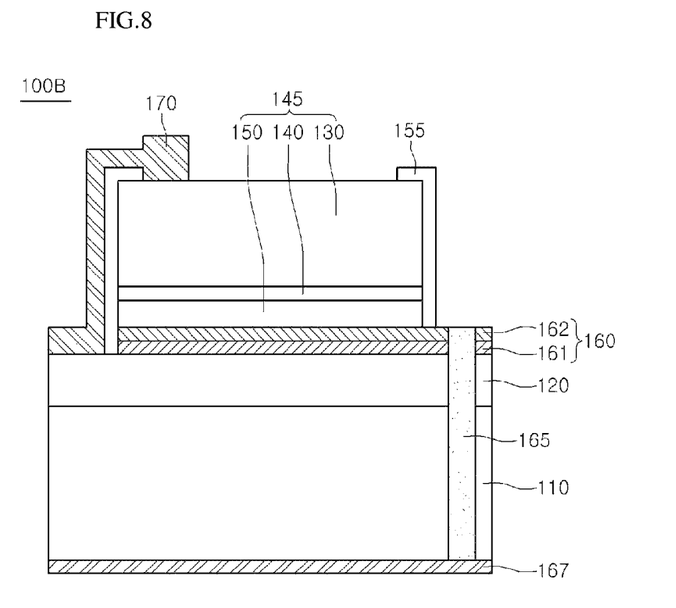
FIG. 8 is a sectional view showing a light emitting device according to the second embodiment.

FIG. 8 is a sectional view showing the light emitting device 100B according to the second embodiment.

Referring to FIG. 8, the light emitting device 100B according to the second embodiment includes an electrode pad 167, a first substrate 110 on the electrode pad 167, a protective layer 120 on the first substrate 110, a electrode layer 160 on the protective layer 120, a conductive through hole 165 formed through the electrode layer 160, the protective layer 120 and the first substrate 110 to electrically connect the electrode layer 160 with the electrode pad 167, a light emitting structure 145 formed on the electrode layer 160 to generate the light, and a first electrode 170 having one end disposed on the top surface of the light emitting structure 145 and the other end disposed on the protective layer 120.

The light emitting device 100B according to the second embodiment is identical to the light emitting device 100 according to the first embodiment except that the electrode pad 167 and the conductive through hole 165 are provided instead of the second electrode shown in FIG. 1.

Since the electrode pad 167 is formed on the bottom surface of the light emitting device 100B, the light emitting device 100B can be electrically connected to the external electrode through the die bonding scheme.

The conductive through hole 165 can be formed by forming a hole through the electrode layer 160, the protective layer 120 and the first substrate 110 and then performing a coating process with respect to the hole, but the embodiment is not limited thereto.

Third Embodiment

Hereinafter, a light emitting device 100C and a method of manufacturing the light emitting device 100C according to the third embodiment will be described. The description about the elements and structures that have already been explained in the first embodiment will be omitted or briefly explained in order to avoid redundancy.

Figure 9:
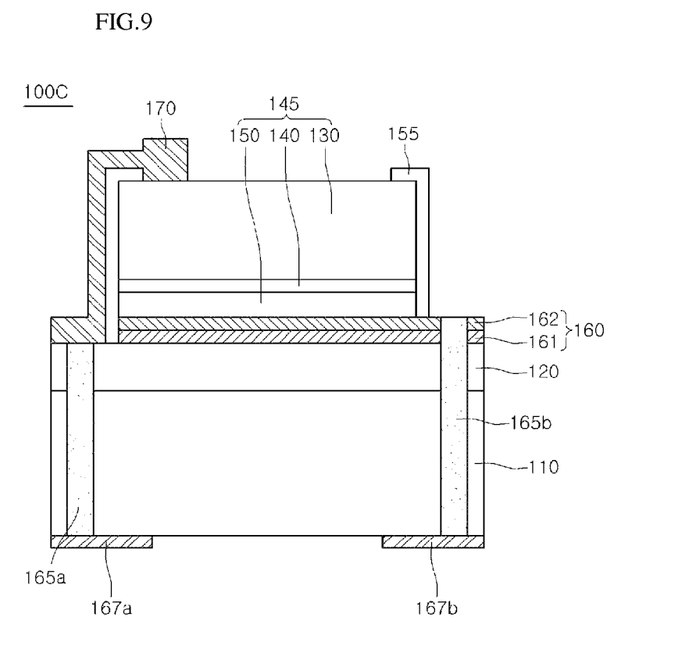
FIG. 9 is a sectional view showing a light emitting device according to the third embodiment.

FIG. 9 is a sectional view showing the light emitting device 100C according to the third embodiment.

Referring to FIG. 9, the light emitting device 100C according to the third embodiment includes a first substrate 110, a protective layer 120 on the first substrate 110, a electrode layer 160 on the protective layer 120, a light emitting structure 145 formed on the electrode layer 160 to generate the light, a first electrode 170 having one end disposed on the top surface of the light emitting structure 145 and the other end disposed on the protective layer 120, first and second electrode pads 167a and 167b on the bottom surface of the first substrate 110, a first conductive through hole 165a formed through the protective layer 120 and the first substrate 110 to electrically connect the first electrode 170 with the first electrode pad 167a, and a second conductive through hole 165b formed through the electrode layer 160, the protective layer 120 and the first substrate 110 to electrically connect the electrode layer 160 with the second electrode pad 167b.

The light emitting device 100C according to the third embodiment is identical to the light emitting device 100 according to the first embodiment except that the first and second electrode pads 167a and 167b and the first and second conductive through holes 165a and 165b are provided instead of the second electrode shown in FIG. 1.

The first electrode pad 167a is formed at one side of the bottom surface of the first substrate 110, and the second electrode pad 167b is formed at the other side of the bottom surface of the first substrate 110.

Since the first and second electrode pads 167a and 167b are formed on the bottom surface of the light emitting device 100C, the light emitting device 100C can be electrically connected to the external electrode through the die bonding scheme without using a wire.

The first conductive through hole 165a can be formed by forming a hole through the protective layer 120 and the first substrate 110 and then performing a coating process with respect to the hole. In addition, the second conductive through hole 165b can be formed by forming a hole through the electrode layer 160, the protective layer 120 and the first substrate 110 and then performing a coating process with respect to the hole, but the embodiment is not limited thereto.

Fourth Embodiment

Hereinafter, a light emitting device 100D and a method of manufacturing the light emitting device 100D according to the fourth embodiment will be described. The description about the elements and structures that have already been explained in the first embodiment will be omitted or briefly explained in order to avoid redundancy.

Figure 10:
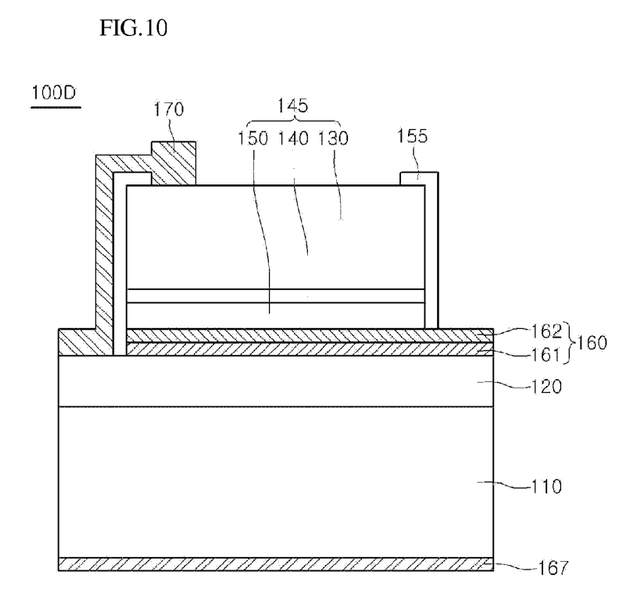
FIG. 10 is a sectional view showing a light emitting device according to the fourth embodiment.

FIG. 10 is a sectional view showing the light emitting device 100D according to the fourth embodiment.

Referring to FIG. 10, the light emitting device 100D according to the fourth embodiment includes an electrode pad 167, a first substrate 110 formed on the electrode pad 167 and having electric conductivity, a protective layer 120 on the first substrate 110, a electrode layer 160 on the protective layer 120, a light emitting structure 145 formed on the electrode layer 160 to generate the light, and a first electrode 170 having one end disposed on the top surface of the light emitting structure 145 and the other end disposed on the protective layer 120.

The light emitting device 100D according to the fourth embodiment is identical to the light emitting device 100 according to the first embodiment except that the first substrate 110 has electric conductivity and the electrode pad 167 is provided instead of the second electrode shown in FIG. 1.

The electrode pad 167 supplies power to the light emitting device 100D together with the first electrode 170.

To this end, the protective layer 120 must include material and polarity adapted to make ohmic contact with the electrode layer 160 such that the power can be transferred from the electrode pad 167 to the light emitting structure 145.

In addition, the first substrate 110 having electric conductivity may include semiconductor material. For instance, the first substrate 110 may include GaAs, GaN, ZnO, Si or Ge, but the embodiment is not limited thereto.

Since the electrode pad 167 is formed on the bottom surface of the light emitting device 100D, the light emitting device 100D can be electrically connected to the external electrode through the die bonding scheme.

Fifth Embodiment

Hereinafter, a light emitting device 100E and a method of manufacturing the light emitting device 100E according to the fifth embodiment will be described with reference to the third embodiment.

Figure 11:
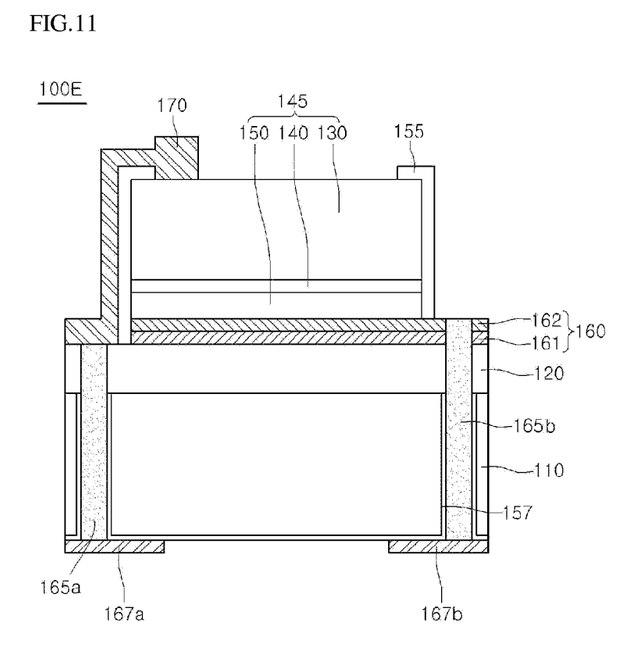
FIG. 11 is a sectional view showing a light emitting device according to the fifth embodiment.

FIG. 11 is a sectional view showing the light emitting device 100E according to the fifth embodiment.

Referring to FIG. 11, the light emitting device 100E according to the fifth embodiment includes a first substrate 110 having electric conductivity, a protective layer 120 on the first substrate 110, a electrode layer 160 on the protective layer 120, a light emitting structure 145 formed on the electrode layer 160 to generate the light, a first electrode 170 having one end disposed on the top surface of the light emitting structure 145 and the other end disposed on the protective layer 120, first and second electrode pads 167a and 167b on the bottom surface of the first substrate 110, a first conductive through hole 165a formed through the protective layer 120 and the first substrate 110 to electrically connect the first electrode 170 with the first electrode pad 167a, a second conductive through hole 165b formed through the electrode layer 160, the protective layer 120 and the first substrate 110 to electrically connect the electrode layer 160 with the second electrode pad 167b, and an insulating structure 157 for insulating the first substrate 110 from the first and second conductive through holes 165a and 165b and the first and second electrode pads 167a and 167b.

The fifth embodiment is identical to the third embodiment except that the first substrate 110 has electrical conductivity.

Since the first substrate 110 has electrical conductivity, the insulating structure 157 is provided to insulate the first substrate 110 from the first and second conductive through holes 165a and 165b and the first and second electrode pads 167a and 167b.

In detail, the insulating structure 157 is provided between the first substrate 110 and the first and second conductive through holes 165a and 165b and between the first substrate 110 and the first and second electrode pads 167a and 167b.

For instance, the insulating structure 157 includes insulating material, such as $SiO_2$, $Si_xO_y$, $Si_3N_4$, $Si_xN_y$, $SiO_xN_y$, or $Al_2O_3$, but the embodiment is not limited thereto.

Figure 12:
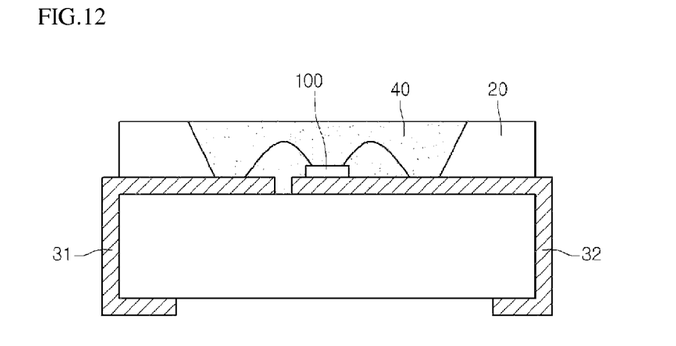
FIG. 12 is a sectional view showing a light emitting device package including a light emitting device according to the embodiment.

FIG. 12 is a sectional view showing a light emitting device package having the light emitting device 100 according to the embodiment.

Referring to FIG. 12, the light emitting device package includes a body 20, first and second electrode layers 31 and 32 formed on the body 20, the light emitting device 100 provided on the body 20 and electrically connected to the first and second electrode layers 31 and 32 and a molding member 40 that surrounds the light emitting device 100.

The body 20 may include silicon, synthetic resin or metallic material. An inclined surface may be formed around the light emitting device 100.

The first and second electrode layers 31 and 32 are electrically isolated from each other to supply power to the light emitting device 100. In addition, the first and second electrode layers 31 and 32 reflect the light emitted from the light emitting device 100 to improve the light efficiency and dissipate heat generated from the light emitting device 100 to the outside.

The light emitting device 100 can be installed on the body 20 or the first and second electrode layers 31 and 32.

As shown in FIG. 12, the light emitting device 100 is electrically connected to the first and second electrode layers 31 and 32 through a wire bonding scheme. In addition, the light emitting device 100 can be electrically connected to the first and second electrode layers 32 through a die bonding scheme or a flip chip scheme, but the embodiment is not limited thereto.

The molding member 40 surrounds the light emitting device 100 to protect the light emitting device 100. In addition, the molding member 40 may include phosphors to change the wavelength of the light emitted from the light emitting device 100.

The light emitting device package is provided with at least one light emitting device disclosed in the embodiments. The embodiment may not limit the number of light emitting device installed in the light emitting device package.

Figure 13:
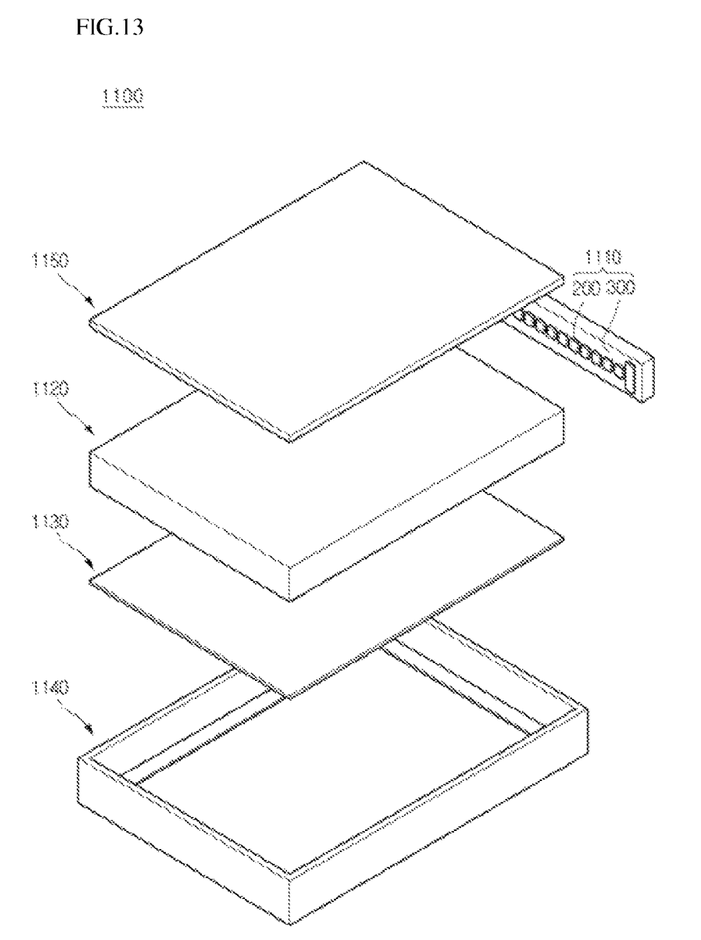
FIG. 13 is an exploded perspective view showing a backlight unit including a light emitting device or a light emitting device package according to the embodiment.

FIG. 13 is an exploded perspective view showing a backlight unit 1100 including a light emitting device package according to the embodiment. The backlight unit 1100 shown in FIG. 13 is an example of an illumination system and the embodiment is not limited thereto.

Referring to FIG. 13, the backlight unit 1100 includes a bottom frame 1140, a light guide member 1120 installed in the bottom frame 1140, and a light emitting module 1110 installed at one side or on the bottom surface of the light guide frame 1120. In addition, a reflective sheet 1130 is disposed below the light guide member 1120.

The bottom frame 1140 has a box shape having a top surface being open to receive the light guide member 1120, the light emitting module 1110 and the reflective sheet 1130 therein. In addition, the bottom frame may include metallic material or resin material, but the embodiment is not limited thereto.

The light emitting module 1110 may include a substrate and a plurality of light emitting device packages installed on the substrate. The light emitting device packages provide the light to the light guide member 1120.

As shown in FIG. 13, the light emitting module 1110 is installed on at least one inner side of the bottom frame 1140 to provide the light to at least one side of the light guide member 1120.

In addition, the light emitting module 1110 can be provided below the bottom frame 1140 to provide the light toward the bottom surface of the light guide member 1120. Such an arrangement can be variously changed according to the design of the backlight unit 1100 and the embodiment is not limited thereto.

The light guide member 1120 is installed in the bottom frame 1140. The light guide member 1120 converts the light emitted from the light emitting module 1110 into the surface light to guide the surface light toward a display panel (not shown).

The light guide member 1120 may include a light guide plate. For instance, the light guide plate can be manufactured by using acryl-based resin, such as PMMA (polymethyl methacrylate), PET (polyethylene terephthalate), PC (polycarbonate), COC or PEN (polyethylene naphthalate) resin.

An optical sheet 1150 may be provided over the light guide member 1120.

The optical sheet 1120 may include at least one of a diffusion sheet, a light collection sheet, a brightness enhancement sheet, and a fluorescent sheet. For instance, the optical sheet 1120 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected on the display panel by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmittive plate or a transmittive film including phosphors.

The reflective sheet 1130 can be disposed below the light guide member 1120. The reflective sheet 1130 reflects the light, which is emitted through the bottom surface of the light guide member 1120, toward the light exist surface of the light guide member 1120.

The reflective sheet 1130 may include resin material having high reflectivity, such as PET, PC or PVC resin, but the embodiment is not limited thereto.

Figure 14:
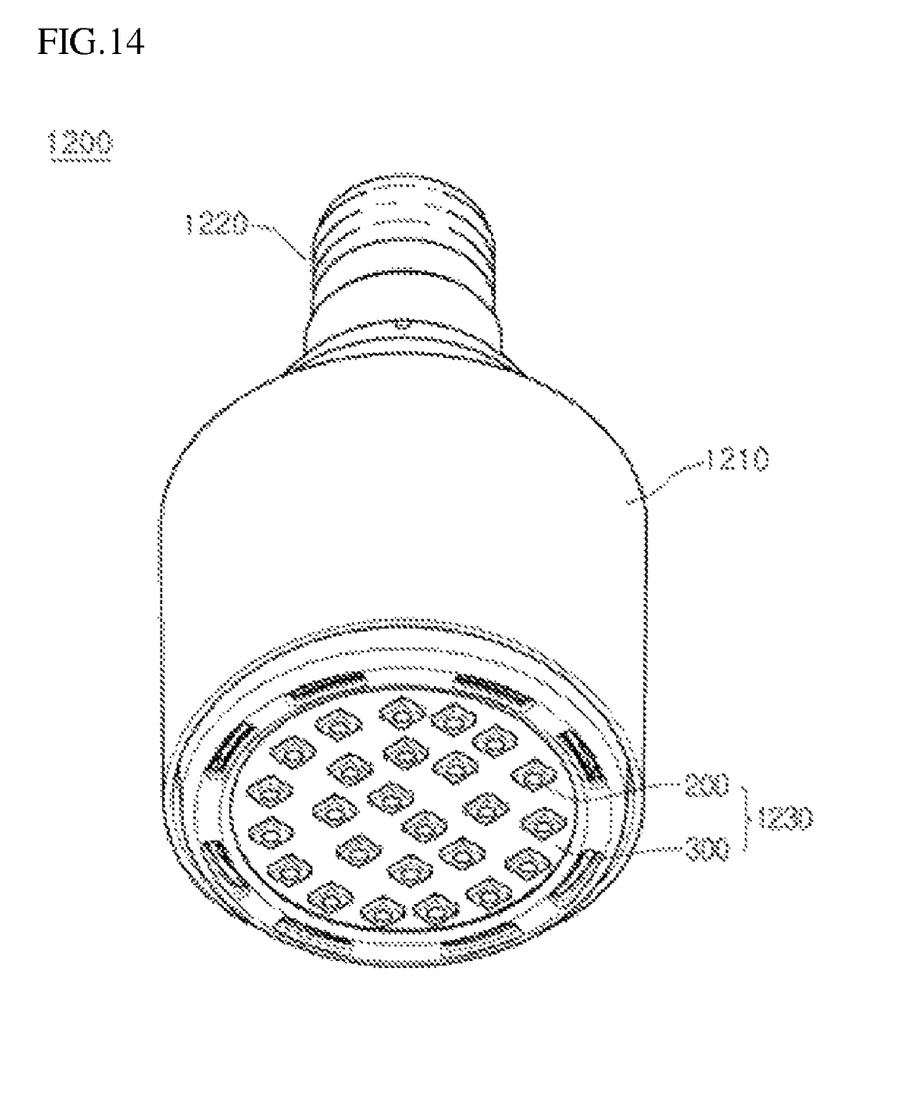
FIG. 14 is a perspective view showing an illumination unit including a light emitting device or a light emitting device package according to the embodiment.

FIG. 14 is a perspective view showing an illumination unit 1200 including a light emitting device package according to the embodiment. The illumination unit 1200 shown in FIG. 14 is an example of an illumination system and the embodiment is not limited thereto.

Referring to FIG. 14, the illumination unit 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes metallic material or resin material.

The light emitting module 1230 may include a substrate 300 and at least one light emitting device package 200 installed on the substrate 300.

The substrate 300 includes an insulating member printed with a circuit pattern. For instance, the substrate 300 includes a PCB (printed circuit board), an MC (metal core) PCB, an F (flexible) PCB, or a ceramic PCB.

In addition, the substrate 300 may include material that effectively reflects the light. The surface of the substrate 300 can be coated with a color, such as a white color or a silver color, to effectively reflect the light.

At least one light emitting device package 200 according to the embodiment can be installed on the substrate 300. Each light emitting device package 200 may include at least one LED (light emitting diode). The LED may include a colored LED that emits the light having the color of red, green, blue or white and a UV (ultraviolet) LED that emits UV light.

The LEDs of the light emitting module 1230 can be variously arranged to provide various colors and brightness. For instance, the white LED, the red LED and the green LED can be arranged to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow phosphors. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 14, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the illumination system as mentioned above, at least one of the light guide member, the diffusion sheet, the light collection sheet, the brightness enhancement sheet and the fluorescent sheet is provided in the path of the light emitted from the light emitting module, so that the desired optical effect can be achieved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a substrate;
    a protective layer on the substrate;
    an electrode layer on the protective layer;
    a light emitting structure disposed on the electrode layer to generate light and provided with a first semiconductor layer, an active layer under the first semiconductor layer, and a second conductive semiconductor layer under the active layer, wherein the electrode layer comprises a first layer disposed on a top surface of the protective layer and a second layer disposed on the first layer to reflect the light emitted from the light emitting structure;
    a first electrode having a first end disposed on a top surface of the light emitting structure and a second end disposed on the protective layer, wherein the protective layer comes into Schottky contact with at least one of the electrode layer and the first electrode;
    a protective member provided at a lateral side of the light emitting structure, wherein a portion of the protective member is disposed between the light emitting structure and the first electrode; and
    at least one of a diffusion barrier layer and an adhesive reinforcing layer between the first and second layers.

2. The light emitting device as claimed in claim 1, wherein the protective layer comprises at least one of Si, GaN, InN, AlN, InGaN, AlGaN, InAlGaN, AlInN, AlGaAs, InGaAs, AlInGaAs, GaP, AlGaP, InGaP, AlInGaP and InP.

3. The light emitting device as claimed in claim 2, wherein the protective layer comprises n-type dopant or p-type dopant.

4. The light emitting device as claimed in claim 1, wherein breakdown voltage resulted from the Schottky contact is greater than operational voltage of the light emitting structure.

5. The light emitting device as claimed in claim 1, wherein the second layer comprises material that comes into ohmic contact with the light emitting structure.

6. The light emitting device as claimed in claim 1, wherein the second layer comprises at least one of Ag, Rh, Ni, Au, Pd, Ir, Ti, Pt, W and Al.

7. The light emitting device as claimed in claim 1, wherein the first layer comprises at least one of Au, Sn, In, Pd, Cu, Mo, W, Si, Ta, Nb and Ni.

8. The light emitting device as claimed in claim 1, further comprising a second electrode on the electrode layer.

9. The light emitting device as claimed in claim 1, further comprising a first electrode pad disposed at one side of a bottom surface of the substrate and a second electrode disposed at an opposite side of the bottom surface of the substrate, wherein the first electrode pad is electrically connected to the first electrode by a first through hole disposed through the protective layer and the substrate, and the second electrode pad is electrically connected to the electrode layer by a second through hole disposed through the protective layer and the substrate.

10. The light emitting device as claimed in claim 9, wherein the substrate has electric conductivity and an insulating structure is provided between the first and second electrode pads and the substrate and between the first and second conductive through holes and the substrate.

11. The light emitting device as claimed in claim 1, wherein the substrate has electric conductivity and an electrode pad is provided under the substrate.

12. A light emitting device comprising:
    a substrate;
    a protective layer on the substrate;
    an electrode layer on the protective layer, the electrode layer comprising a first layer disposed on a top surface of the protective layer and a second layer disposed on the first layer;
    a light emitting structure disposed on the electrode layer to generate light and provided with a first semiconductor layer, an active layer under the first semiconductor layer, and a second conductive semiconductor layer under the active layer;
    a first electrode having a first end disposed on a top surface of the light emitting structure and a second end disposed on the protective layer, wherein the protective layer comes into Schottky contact with at least one of the electrode layer and the first electrode;
    an electrode pad under the substrate, wherein the electrode pad is electrically connected to the electrode layer via a through hole disposed through the protective layer and the substrate; and
    at least one of a diffusion barrier layer and an adhesive reinforcing layer between the first layer and the second layer.

13. The light emitting device as claimed in claim 12, wherein the light emitting structure and the through hole are vertically separated.

14. The light emitting device as claimed in claim 10, wherein the insulating structure comprises insulating material, such as $SiO_2$, $Si_xO_y$, $Si_3N_4$, $Si_xN_y$, $SiO_xN_y$, or $Al_2O_3$.

15. A light emitting device package comprising:
   a package body;
   a first electrode layer and a second electrode layer on the package body; and
   a light emitting device electrically connected to the first and the second electrode layers,
   wherein the light emitting device comprises:
      a substrate;
      a protective layer on the substrate;
      an electrode layer on the protective layer;
      a light emitting structure disposed on the electrode layer to generate light and provided with a first semiconductor layer, an active layer under the first semiconductor layer, and a second conductive semiconductor layer under the active layer, wherein the electrode layer comprises a first layer disposed on a top surface of the protective layer and a second layer disposed on the first layer to reflect the light emitted from the light emitting structure;
      a first electrode having a first end disposed on a top surface of the light emitting structure and a second end disposed on the protective layer, wherein the protective layer comes into Schottky contact with at least one of the electrode layer and the first electrode;
      a protective member provided at a lateral side of the light emitting structure, wherein a portion of the protective member is disposed between the light emitting structure and the first electrode; and
      at least one of a diffusion barrier layer and an adhesive reinforcing layer between the first and second layers.

16. An illumination system comprising:
   a light emitting module comprising a first substrate and a light emitting device disposed on the substrate,
   wherein the light emitting device comprises:
      a second substrate;
      a protective layer on the second substrate;
      an electrode layer on the protective layer;
      a light emitting structure disposed on the electrode layer to generate light and provided with a first semiconductor layer, an active layer under the first semiconductor layer, and a second conductive semiconductor layer under the active layer, wherein the electrode layer comprises a first layer disposed on a top surface of the protective layer and a second layer disposed on the first layer to reflect the light emitted from the light emitting structure;
      a first electrode having a first end disposed on a top surface of the light emitting structure and a second end disposed on the protective layer, wherein the protective layer comes into Schottky contact with at least one of the electrode layer and the first electrode;
      a protective member provided at a lateral side of the light emitting structure, wherein a portion of the protective member is disposed between the light emitting structure and the first electrode; and
      at least one of a diffusion barrier layer and an adhesive reinforcing layer between the first and second layers.

17. The light emitting device as claimed in claim 1, further comprising:
   an electrode pad under the substrate, wherein the electrode pad is electrically connected to the electrode layer via a through hole disposed through the protective layer and the substrate, wherein the light emitting structure and the through hole are vertically separated.

* * * * *